March 17, 1959 — A. P. STERN — 2,878,376

TRANSISTOR CONVERTER WITH EMITTER CONNECTED TO SERIES-RESONANT LOCAL OSCILLATION CIRCUIT

Filed Oct. 18, 1954

INVENTOR:
ARTHUR P. STERN,
BY George V. Eltgroth
HIS ATTORNEY.

United States Patent Office 2,878,376

Patented Mar. 17, 1959

2,878,376

TRANSISTOR CONVERTER WITH EMITTER CONNECTED TO SERIES-RESONANT LOCAL OSCILLATION CIRCUIT

Arthur P. Stern, Syracuse, N. Y., assignor to General Electric Company, a corporation of New York Application October 18, 1954, Serial No. 462,767

2 Claims. (Cl. 250—20)

The present invention relates to modulation systems and has as an object thereof the production of a modulation system employing a single semiconductor device.

The term "modulation system" is here used in a broad functional sense. It is descriptive of systems in which a characteristic of a first wave is modified by a second wave, thereby producing a resultant wave which differs from the first wave in frequency, in phase, or in amplitude, or combinations of the three. One example of a modulation system is a system in which two waves of comparable frequencies are combined to form a resultant wave of essentially constant amplitude but having a modified frequency equal to the difference between the frequencies of the first two waves. A typical frequency converter such as one finds in a superheterodyne type receiver is of such a type.

Another example of a modulation system is a system in which two waves of dissimilar frequencies are combined to form resultant waves which are modified both in amplitude and in frequency. A modulator for modulating a radio frequency carrier wave with an audio frequency wave is of such a type. Such a modulator produces side bands which have amplitudes essentially dependent on the amplitude of the audio frequency wave and frequencies equal to the sum and difference in frequency between the radio frequency wave and the audio frequency wave.

The present invention provides simplified modulation systems of general application, specific embodiments being shown of a frequency converter and of an amplitude modulator. In each embodiment only a single semiconductor device is required. Since semiconductor devices having three or more electrodes are expensive, it is desirable to use a minimum number in the performance of each function. The present invention discloses arrangements by which a single transistor can be employed to perform jointly the task of modulating one wave by another one which is locally generated, and the task of generating this local wave. In performance of this function, the transistor may also be adjusted to provide substantial amplification by virtue of the fact that in the novel configurations here disclosed, the modulation components first occur in the input circuit of the transistor and hence may be amplified in transit to the output circuit.

Accordingly, it is an object of the invention to provide an improved modulation system.

It is another object of the invention to provide an improved frequency converter.

It is a further object of the invention to provide an improved amplitude modulator.

It is another object of the present invention to provide an improved modulation system employing semiconductor devices.

It is a further object of the present invention to provide a modulation system employing a single transistor which performs jointly the functions of modulating a first wave with a second wave, and generating one of said waves, locally.

It is still another object of the present invention to provide a modulation system employing a single three electrode transistor which performs jointly the functions of modulating a first wave with a second wave and generating one of said waves locally.

These and other objects are achieved in a novel modulation system wherein electric wave energy of a first frequency is applied between the base and emitter of a transistor and locally derived electric wave energy of a second frequency is applied between said base and emitter. The transistor is provided with an oscillation circuit which establishes oscillations in the input circuit. Modulation components arise in the input of the transistor by virtue of operation of the transistor over a nonlinear region of its emitter current characteristic. A frequency selective filter is provided connected to the output circuit of the transistor tuned to reject undesired waves and to select desired modulated waves.

An advantageous mode of deriving local oscillations in a transistor having an alpha greater than unity utilizes the negative impedance characteristic exhibited by such transistors. Oscillations may be excited by use of a relatively large impedance coupled to the base of the transistor, the base connected impedance providing the common return path to signal currents flowing in both the input and output circuits of the transistor. Oscillations may also be advantageously excited by connection of a network having a low impedance in the path between the emitter electrode and ground of such a transistor.

The features of the invention which are believed to be novel are set forth with particularity in the appended claims. The invention itself, however, both as to its organization and method of operation together with further objects and advantages thereof may best be understood by reference to the following description when taken in connection with the attached drawings, wherein:

Figure 1:
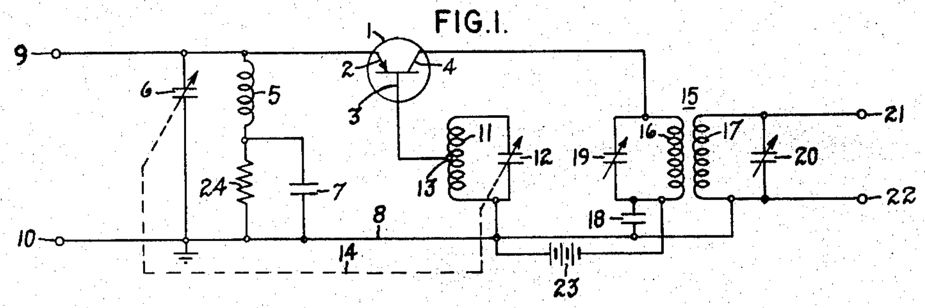
Fig. 1 is a frequency converter wherein a large base electrode connected impedance is employed to facilitate oscillation.

Accordingly, a frequency converter embodying the invention is shown in Fig. 1. At 1 is shown a point contact type transistor having an emitter electrode 2, a base electrode 3 and a collector electrode 4. Coupled to the emitter electrode 2 is a tuned input circuit comprising an inductance 5, and a variable capacitance 6, each having one terminal connected to the emitter 2. The other terminal of inductance 5 is coupled to one terminal of a bypass capacitance 7, whose other terminal is connected to ground bus 8. The impedance of capacitance 7 is low at operating frequencies. The variable capacitance 6 has its other terminal connected to ground. Input terminals 9 and 10 of the frequency converter are connected respectively to the emitter electrode 2 and the ground bus 8.

The base electrode 3 is connected to a tuned circuit comprising an inductance 11 and a variable capacitance 12, the connection to the base electrode being made at a tap 13 on inductance 11. The inductance 11 and a capacitance 12 are connected in parallel to form a parallel resonant circuit, one terminal of which is connected to the ground bus 8. To facilitate single control tuning of the frequency converter, when it is desired to convert frequencies lying over a band to frequencies to a fixed intermediate frequency, the variable capacitance 6 and the variable capacitance 12 may be ganged, this relation being illustrated symbolically by the broken line 14.

The collector electrode 4 is connected to an output transformer 15 having a primary inductance 16 and a secondary inductance 17 electro-magnetically coupled to it. One terminal of the primary inductance 16 is connected to the collector 4. A bypass capacitance 18 is provided coupled between the ground bus 8 and the other terminal of the primay inductance 16, capacitance 18 having a value which provides a low impedance at operating frequencies. A tuning capacitance 19 is provided which shunts inductance 16. The secondary inductance 17 is connected in shunt with a second tuning capacitance 20. Output terminals 21 and 22 are connected respectively to one and the other terminals of the secondary inductance 17, one terminal of inductance 17 being connected to the ground bus 8.

Direct current energization of transistor 1 is provided by means of the source 23, having its positive terminal connected to the ground bus 8. The negative terminal of source 23 is connected to the terminal of inductance 16 remote from collector 4. Adjustment of the emitter bias is provided by a resistance 24 coupled to the terminal of inductance 5 remote from the emitter 2 and to the ground bus 8.

The frequency converter may now be considered in performance of the functions of frequency conversion. Radio frequency signals are applied to the input terminals 9 and 10. The tank circuit comprising inductance 5 and capacitance 6 is tuned to provide an impedance maximum at the frequency of the desired applied frequencies and provides selective action for obtaining the desired signals.

The signal voltage developed in the tuned input circuit is applied between the emitter electrode 2 and the base electrode 3, the path to the base electrode including a portion of the tuned circuit connected to the base electrode. The base electrode connected tuned circuit comprising inductance 11 and capacitance 12 is tuned to present an impedance maximum at a frequency differing from the frequency of said input tuned circuit. By virtue of this difference in tuning, the impedance presented to the selected signals is low, so that the voltage drop across the base connected tuned circuit is small and most of the signal voltage is developed between the emitter electrode 2 and the base electrode 3.

The collector electrode 4 is connected to output transformer 15. Transformer 15 is tuned to select signals at a predetermined frequency difference between the frequency of the selected applied signal and the resonant frequency of the base connected tuned circuit.

Oscillations are generated by transistor 1 at a frequency determined essentially by the tuned circuit connected to the base electrode 3. The parallel resonant base connected tuned circuit presents a large impedance at the oscillation frequency between the base and ground. At the same time the collector connected tuned circuit, which is tuned to a different frequency, presents a relatively low impedance path to waves at the resonant frequency of the base connected tuned circuit. Likewise, the emitter connected tuned circuit presents a relatively low impedance at the resonant frequency of the base connected tuned circuit. These alternating current conditions of low impedances in the emitter and collector electrode circuits and high impedances in the base electrode circuit favor the generation of oscillations at the resonant frequency of the base connected tuned circuit.

The mechanism of oscillation generation may be treated qualitatively. Let us assume that a source of alternating voltage is applied between the tap 13 of the base connected inductance 11 and ground. Let us further assume that at the instant under consideration the source is of negative polarity at the terminal connected to the base electrode 3 and of positive polarity at the terminal connected to ground. The applied voltage makes the emitter more positive than the base, and increases the current flowing from the emitter to the base. By virtue of the inherent current amplification of a transistor in which the alpha is greater than unity, an increase in collector current is caused which is greater than the increase in the emitter current. Consequently, the base current, which equals the difference between the collector and emitter currents, is increased in a direction opposed to the emitter current flow by a factor of approximately $(\alpha-1)$. The transistor can then be described as exhibiting a negative resistance. The inversely directed increase in base current produces in any impedance coupled between the base electrode and ground, a voltage drop which tends to make the base electrode even more negative, and the emitter electrode relatively more positive. The feedback increment in voltage in the base-emitter circuit, occasions a further increase in emitter current, and a corresponding increase in collector current. The process of re-enforcement of emitter current continues until the non-linearity of the transistor characteristic in the circuit limits the emitter current excursion.

The reaction of the transistor 1 to the postulated generator connected to the base electrode indicates generally the negative resistance type of characteristic exhibited by the transistor between its base electrode and ground. Connection of an energy storage circuit to an active network having a negative resistance characteristic, such as the transistor just described, causes oscillations in the network at a frequency dependent on the rate at which the storage circuit can be charged and discharged by the active network. The base connected tuned circuit illustrated in Fig. 1 is such an energy storage circuit. Considerable energy may be dissipated in the energy storage circuit and other portions of the circuit before oscillations are prohibited, the allowable energy losses being related to the amount of feedback energy available.

Mathematically, the observed conditions for oscillation of the circuit, assuming that the transistor is properly biased, may be explained by use of the equations for the equivalent circuit, into which the transistor constants and the associated impedances are substituted.

Figure 2:
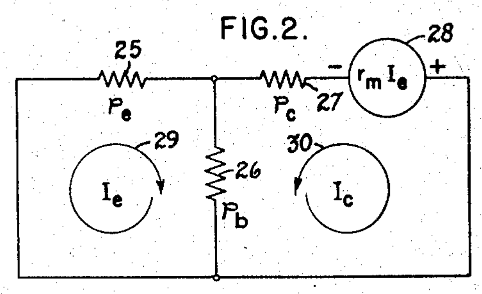
Fig. 2 is an equivalent circuit diagram which is used to explain the operation of the invention.

A suitable equivalent circuit for a transistor oscillator of the type here employed is shown in Fig. 2 as a T type three terminal network. The T network includes a lumped emitter impedance $P_e$ at 25, representing the sum of the external emitter connected impedance $Z_e$ and the internal emitter impedance $r_e$:

$$P_e= {}_e+r_e \qquad (1)$$

a lumped base impedance $P_b$ at 26, representing the sum of the external base connected impedance $Z_b$ and the internal base impedance $r_b$:

$$P_b=Z_b+r_b \qquad (2)$$

and a lumped collector impedance $P_c$ at 27, representing the sum of the external collector connected impedance $Z_c$ and the internal collector impedance $r_c$:

$$P_c=Z_c+r_c \qquad (3)$$

The T is formed of impedances $P_e$, $P_c$, $P_b$, joined at a common point. The impedance $P_e$, shown at 25, forms the input horizontal arm of the T network while the impedance $P_c$ shown at 27, forms the output horizontal arm of the T network. The vertical arm of the T is formed by the impedance $P_b$ shown at 26. The amplification characteristic is represented by a generator at 28, which produces a voltage equal to the product of the trans-resistance $r_m$ and the emitter current $I_e$, but of opposite polarity. The input circuit is completed by connecting the outer terminals of $P_e$ and $P_b$. The emitter current $I_e$ flowing in the input circuit is assumed to flow in the direction through $P_e$ toward the center of the T, as shown symbolically by the arrow 29. The output circuit is completed by connecting the outer terminals of $P_c$ to the negative terminal of generator 28, and the outer terminal of $P_b$ to the positive terminal of generator 28. The collector current $I_c$ flowing in the output circuit is assumed to flow in the direction through $P_c$ toward the center of the T, as shown symbolically by the arrow 30.

In order to determine the condition for oscillation, the loop voltage equations are solved to find the conditions necessary to make the network impedance negative or zero:

$$I_e(P_e+P_b)+I_cP_b=0 \quad (4)$$

$$I_e(P_b+r_m)+I_c(P_b+P_c)=0 \quad (5)$$

We may then obtain the circuit determinant Δ:

$$\Delta=(P_e+P_b)(P_b+P_c)-P_b(P_b+r_m) \quad (6)$$

The condition for oscillation is that the circuit determinant be negative or equal to zero:

$$\Delta\leqq 0 \quad (7)$$

Rearranging Expression 6:

$$(P_e+P_b)(P_b+P_c)\leqq P_b(P_b+r_m) \quad (8)$$

$$\frac{P_e+P_b}{P_b}\leqq\frac{P_b+r_m}{P_b+P_c} \quad (9)$$

$$\frac{P_e}{P_b}\leqq\frac{P_b+r_m}{P_c+P_b}-1 \quad (10)$$

Substituting for $P_e$, $P_b$, and $P_c$ their component impedances defined in Expressions 1, 2 and 3, we obtain finally:

$$\frac{Z_e+r_e}{Z_b+r_b}\leqq\frac{r_m+Z_b+r_b}{Z_c+r_c+Z_b+r_b}-1 \quad (11)$$

By inspection of Expression 11, it may be seen intuitively that a large $Z_b$ will tend to make the left hand expression small and so satisfy Expression 11. Similarly, a small $Z_e$ will tend to make the left hand expression small and so satisfy Expression 12.

The mathematical requirements for oscillation also implicitly require that the transistor have an alpha (α) greater than unity. It may be noted that the left hand member of Expression 11 must always be positive. This then requires that the right hand fraction not only be positive, but that it exceed one. The right hand fraction, however, can only exceed one, if $r_m$ be greater than $(r_c+Z_c)$. When the transistor has an alpha greater than unity, $r_m$ being approximately equal to the product of α and $r_c$, $r_m$ will usually exceed $r_c+\ _c$ if $Z_c$ is chosen to be sufficiently small. The mathematical considerations expressed and deductions drawn from them correspond rather closely to experiment.

In producing frequency conversion, the transistor 1 performs jointly the functions of mixing or heterodyning and oscillation generation. Having now considered the mode of oscillation generation we may now consider the manner in which mixing action occurs. As previously explained, locally generated oscillations are applied between the base electrode 3 and ground, while the input signals are applied between the emitter and ground. In this manner, the total emitter to base voltage is the algebraic sum of the two applied waves. The heterodyne or beat frequency components appear in the collector circuit, and the desired component is selected by the tuned output transformer and supplied to the output terminals 21 and 22. In the first embodiment, the output transformer is tuned to the difference frequency between the oscillator and input frequency.

The mixing action may be qualitatively explained by considering the non-linear manner in which the emitter current varies with the applied emitter voltage. Under the influence of oscillations, the emitter current tends to swing through a range of values which is generally wide relative to the current swing attributable to the input signal. In traversing the range of oscillation, the transistor exhibits a substantial non-linearity in its input characteristic. Hence, the periodic change at oscillator frequency in the input characteristic of the transistor provides the non-linear characteristic at the signal input terminals required for mixing the signal with the locally generated oscillations for production of the desired heterodyne components. To provide operation in a region of greater non-linearity in the input characteristic of the transistor, the emitter current may be reduced, at some reduction in the amplitude of oscillations produced.

In operation, the arrangement shown in Fig. 1 has been found to produce a conversion gain of approximately 10 decibels when a conventional point contact transistor is employed adjusted to operate at an emitter current of approximately 80 micro-amperes.

Figure 3:
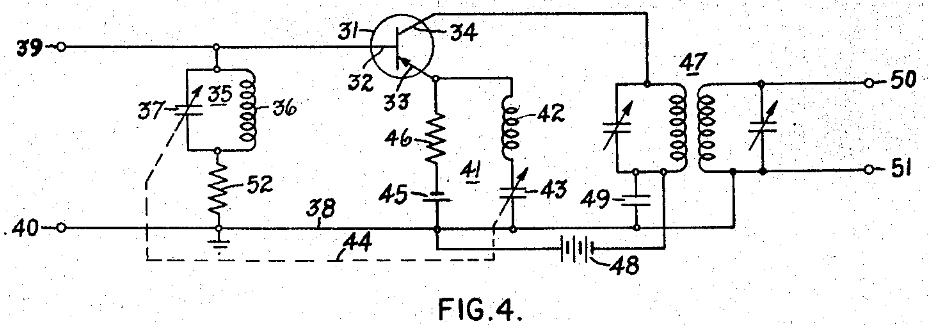
Fig. 3 is a frequency converter wherein a low impedance is coupled between the emitter and ground to facilitate oscillation.

Fig. 3 illustrates a second frequency converter in accordance with the invention. A transistor 31, having an alpha greater than unity, is employed in a frequency conversion circuit which also utilizes the negative impedance characteristic exhibited by such transistors in the generation of local oscillations.

The transistor 31 is provided with a base electrode 32, an emitter electrode 33 and a collector electrode 34. The base electrode 32 is connected to one terminal of a tuned circuit comprising an inductance 36 having a variable capacitance 37 shunting the inductance. The other terminal of the tuned circuit is connected through a resistance 52 to the ground bus 38. The converter input terminals 39 and 40 are connected respectively to the base electrode 32 and the ground bus 38.

A second tuned circuit 41 is connected to the emitter 33. The tuned circuit 41 comprises an inductance 42 having one terminal connected to the emitter 33 and the other terminal connected to one terminal of a variable capacitance 43. The other terminal for capacitance 43 is connected to the ground bus 38. The tuned circuit 41 controls the frequency of oscillation in a manner shortly to be described. For convenience in tuning the frequency converter over a range of frequencies, the variable capacitance 43 may be ganged with the variable capacitance 37, as shown symbolically by the broken line 44. Proper bias for forward conduction of the emitter 33 is provided by the battery 45 connected in series with a resistance 46 between the emitter 33 and the ground bus 38.

The collector electrode 34 is connected to one input terminal of a double tuned output transformer 47. The other input terminal of the output transformer is connected to the negative terminal of a source 48 of direct potentials. The positive terminal of source 48 is connected to the ground bus 38. Capacitance 49, providing a low impedance to applied frequencies, is connected between the negative terminal of source 48 and ground. The output terminals of the output transformer 47 are connected respectively to the output terminals 50 and 51 of the frequency converter, the terminal 51 being connected to the ground bus 38.

In operation, signals are applied between the input terminals 39 and 40. The desired signal is selected by tuned circuit 35 and applied to the base electrode 32. At the same time oscillations are established in the transistor at approximately the series resonant frequency of the tuned circuit 41 connected to the emitter 33. The voltage difference between the base and emitter electrodes is the sum of the selected applied signal and the locally generated oscillation. By virtue of the non-linear nature of the emitter current as a function of the applied alternating potentials when the potentials are of substantial magnitude, a product term corresponding to the beat or heterodyne frequency appears in the actual emitter current, and also in the output collector current. The desired beat frequency component is selected by the tuned output transformer 47 and supplied to the output terminals 50 and 51.

The manner in which oscillations are generated may be explained in a manner analogous to that employed in connection with Fig. 1. The expression 11, as explained above, indicates generally that a reduction in the impedance $Z_e$ connected between the emitter and ground tends to make the network impedance negative and so create an oscillatory condition. The series resonant tuned circuit exhibits a low impedance at particular frequencies and thus tends to establish oscillations in the transistor 31 at those frequencies at which the impedance is low.

The resistance 52 has a value which is small with regard to the impedance at resonance of the tuned circuit connected to the base electrode 32, so as to insure adequate selectivity before application of the signal voltage to the base and emitter electrodes. The resistance 52 serves to enhance oscillations, and is particularly necessary when transistors are employed which have low internal base resistances. In some point contact transistors having high internal base resistances, the resistance 52 is unnecessary.

Figure 4:
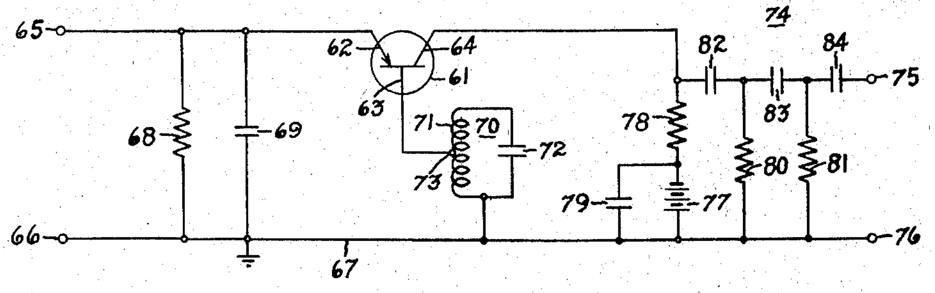
Fig. 4 is an amplitude modulator wherein local oscillations are derived in a manner similar to that shown in Fig. 1.

An amplitude modulation system embodying the invention is shown in Fig. 4. In this embodiment a single transistor is employed to obtain an amplitude modulated radio frequency signal. The transistor performs jointly the process of generating a radio frequency carrier and the process of modulating an audio signal upon this carrier.

The modulation system employs a transistor 61 having an emitter electrode 62, a base electrode 63, and a collector electrode 64. The input terminals 65 and 66 of the modulation system are connected respectively to the emitter electrode 62 and a grounded bus 67. A resistance 68 and a capacitance 69 are connected between the emitter 62 and the ground bus 67.

The oscillation circuit is connected with the base electrode 63. It comprises a tuned circuit 70 including a tapped inductance 71 and a capacitance 72 connected in shunt with inductance 71. One end terminal of the tuned circuit 70 is connected to ground. The base electrode 63 is connected to the tap 73 on inductance 71.

The collector electrode 64 is connected to suitable energizing potentials and through a high pass filter 74 to the output terminals 75 and 76 of the modulation system. The energization of the collector electrode 64 is provided by a source 77 of direct potentials having its positive terminal connected to the ground bus 67 and its negative terminal connected to one terminal of resistance 78 whose other terminal is connected to the collector electrode 64. A capacitance 79 shunts the source 77. The high pass filter comprises two resistances 80 and 81 and two capacitances 82 and 83. Capacitances 82, 83 and 84 are serially connected in the order recited between the collector electrode 64 and the output terminal 75. The resistance 80 is connected between the common terminals of capacitances 82 and 83 and ground bus 67. The resistance 81 is connected between the common terminal of capacitance 83 and 84 and the ground bus 67.

Operation of the modulation system shown in Fig. 4 may now be considered. The tuned circuit 70 connected to the base electrode 63 establishes a high impedance between the base electrode 63 and the ground bus 67 at the frequency to which the tuned circuit is resonant. Simultaneously, the capacitance 69 and resistance 79 are chosen to have a value such that a relatively low impedance exists at the resonant frequency of the tuned circuit 70 between the emitter electrode 62 and ground bus 67 and the collector electrode 64 and ground bus 67, respectively. These conditions favor the generation of oscillations in the transistor 61 at the resonant frequency of the tuned circuit 70. Once oscillations have been established, audio modulation signals may be applied to the input terminals 65 and 66 of the frequency converter. These signals are then established principally between the emitter electrode 62 and the base electrode 63, and provide in combination with the oscillations arising between the base electrode and ground, a net base-emitter voltage which is a sum of the audio voltage and the oscillation voltage generated in the transistor 61. The resistance 68, resistance 78 and magnitude of source 77 are chosen to have values such that the transistor operates non-linearly. When so adjusted the sum voltages encountered produce emitter current flows which are a non-linear function of the net base-emitter voltage so as to establish modulation components in the input current of the transistor 61. The input current is then accompanied by a corresponding output current to the collector 64 which contains these modulation components, and a corresponding voltage is established across the output resistance 78. In order to filter out audio frequency components which occur in the output circuit, the high pass filter 74 is provided. By virtue of the high pass filter 74, the audio frequency components are eliminated and a signal is transduced to the output terminals 75 and 76 which is essentially a carrier wave of the frequency of the oscillations developed in the transistor 61 modulated in amplitude by the audio signals applied to the input terminals 65 and 66.

The modulator so discussed is of simple design and well suited to performing the function of converting the audio signals produced in a phonograph pickup to radio frequencies which may be picked up in a nearby radio receiver. Since the radio receiver in itself possesses tuned circuits for eliminating undesired modulation components, no further tuned circuits are usually necessary for this purpose.

The high pass filter illustrated is essentially a three section filter wherein the resistance 78 is proportioned to serve primarily as a load resistance for the collector electrode 64. In certain applications, the high pass filter may be reduced to a single section comprising only the capacitance 82 and the resistance 78.

Modulation systems built in accordance with preferred embodiments of the invention are extremely simple, and utilize a minimum of circuit components and connections since no separate feedback loop connections are required in the portion of the circuit which generates local oscillations. It should be noted that the transistor property which permits oscillation in this manner is that the transistor has an alpha greater than unity, thereby permitting the collector signal current to exceed the emitter signal current. At the present time, while most transistors exhibiting this property are of the point contact type, several classes of junction type transistors having alpha greater than unity are also known.

It is also clear that distributed parameter equivalent, such as quarter and half wave lines, may be respectively substituted for the lumped constant parallel and series resonant networks described.

While particular embodiments of the invention have been shown and described, it will be obvious to those skilled in the art that various changes and modifications may be made without departing from the invention in its broader aspects and it is, therefore, intended in the appended claims to cover all such changes and modifications as fall within the true spirit and scope of the invention.

What I claim as new and desire to secure by Letters Patent of the United States is:

1. In a transistor modulation system, a transistor having inherent current amplification by virtue of an alpha greater than unity, said transistor having base, emitter and collector electrodes, a parallel resonant signal input circuit resonant at a first frequency coupled between said base electrode and a common point for selectively coupling signals of said first frequency to said transistor, a series resonant circuit coupled between said emitter electrode and said common point, and resonant at a second frequency, means for simultaneously tuning both resonant circuits to maintain a desired difference between said first and second frequencies, a frequency selective filter for selection of a desired heterodyne of waves of said first and second frequencies coupled between said collector electrode and said common point, and means including said tuned circuits utilizing the inherent current amplification of said transistor for creating an unstable condition in said system at the frequency of series resonance of said second tuned circuit, whereby oscillatory waves of said second frequency are generated in said transistor and mixed therein with input signal waves to produce a desired heterodyne component at the output of said filter.

2. In a transistor modulation system, a transistor having inherent current amplification by virtue of an alpha greater than unity, said transistor having base, emitter and collector electrodes, means for operating said transistor in common emitter configuration with respect to input signals comprising a first tuned circuit exhibiting an impedance maximum at a first frequency coupled between said base electrode and a common point for selectively coupling input signals of said first frequency to said transistor, a second tuned circuit exhibiting an impedance minimum at a second frequency coupled between said emitter electrode and said common point, means for simultaneously tuning both tuned circuits to maintain a desired difference between said first and second frequencies, a frequency selective filter for selection of a desired heterodyne of waves of said first and second frequencies coupled between said collector electrode and said common point, and means including said tuned circuits utilizing the inherent current amplification of said transistor for creating an unstable condition in said system at the frequency of the impedance minimum of said second tuned circuit, whereby oscillatory waves of said second frequency are generated in said transistor and mixed therein with input signal waves to produce a desired heterodyne component at the output of said filter.

References Cited in the file of this patent

UNITED STATES PATENTS 2,691,074 Eberhard ---------------- Oct. 5, 1954
2,775,705 Overbeek ---------------- Dec. 25, 1956

FOREIGN PATENTS 506,781 Belgium ---------------- Nov. 14, 1951

OTHER REFERENCES

Transistor Oscillators by Oser et al., RCA Review, September 1952, pp. 369–383.